(12) United States Patent
Lee

(10) Patent No.: US 7,994,018 B2
(45) Date of Patent: Aug. 9, 2011

(54) METHOD FOR FABRICATING SEMICONDUCTOR DEVICE

(75) Inventor: Doo Sung Lee, Taebaek-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/582,604

(22) Filed: Oct. 20, 2009

(65) Prior Publication Data

US 2010/0120219 A1    May 13, 2010

(30) Foreign Application Priority Data

Nov. 7, 2008 (KR) .................. 10-2008-0110201

(51) Int. Cl.
*H01L 21/76* (2006.01)

(52) U.S. Cl. .................. 438/433; 438/404; 438/424

(58) Field of Classification Search .......... 438/433, 438/424, 404
See application file for complete search history.

(56) References Cited

U.S. PATENT DOCUMENTS

| | | | | |
|---|---|---|---|---|
| 5,372,950 A * | 12/1994 | Kim et al. | ...... | 438/444 |
| 6,362,070 B1 * | 3/2002 | Villa et al. | ...... | 438/404 |
| 6,746,936 B1 * | 6/2004 | Lee | ...... | 438/445 |
| 6,897,118 B1 | 5/2005 | Poon et al. | | |
| 6,939,779 B2 * | 9/2005 | Takahashi | ...... | 438/426 |
| 7,759,216 B2 * | 7/2010 | Ryu et al. | ...... | 438/433 |
| 2004/0082200 A1 * | 4/2004 | Lin et al. | ...... | 438/791 |
| 2008/0160720 A1 * | 7/2008 | Ryu et al. | ...... | 438/433 |

* cited by examiner

*Primary Examiner* — Matthew Smith
*Assistant Examiner* — John M Parker
(74) *Attorney, Agent, or Firm* — The Law Offices of Andrew D. Fortney; Andrew D. Fortney

(57) ABSTRACT

A method for fabricating a semiconductor device is disclosed. The method includes forming a first oxide film, a nitride film, and a second oxide film on a semiconductor substrate in succession, etching the second oxide film and the nitride film to form a second oxide film pattern and a nitride film pattern, exposing a portion of the first oxide film, performing at least one nitrogen implantation into the semiconductor substrate to form a nitrogen injection region under the exposed portion of the first oxide film, forming a third oxide film over the second oxide film pattern, the nitride film pattern, and the semiconductor substrate, forming a trench that is deeper than the nitrogen ion injection region by etching the semiconductor substrate using the second oxide film pattern as a mask, and filling the trench with an oxide film to form a device isolating film.

20 Claims, 4 Drawing Sheets

METHOD FOR FABRICATING SEMICONDUCTOR DEVICE

CROSS REFERENCE TO RELATED APPLICATION

This application claims the benefit of Korean Patent Application No. 10-2008-0110201, filed on Nov. 7, 2008, which is hereby incorporated by reference as if fully set forth herein.

BACKGROUND OF THE DISCLOSURE

1. Field of the Disclosure

The present invention relates to semiconductor devices, and, more particularly, to a method for fabricating a semiconductor device that can improve conductivity of a channel region in the semiconductor device.

2. Discussion of the Related Art

The conductivity of the channel region in an MOS transistor is controlled by a gate electrode. That is, a current driving capability of a conductive channel is controlled by the gate electrode isolated from the channel region by a thin insulating layer (e.g., a gate oxide) formed on the channel region.

The channel is formed by an application of an appropriate control voltage to the gate electrode. The conductivity of the channel region varies with a dopant concentration and the mobility of the charge carriers in the channel region. The conductivity of the channel region is a major factor in determining the performance of a MOS transistor (e.g., a PMOS transistor).

As semiconductor devices become smaller, mobility of hole charge carriers in a PMOS transistor is reduced, and a desired drain current may become difficult to achieve.

SUMMARY OF THE DISCLOSURE

Accordingly, the present invention is directed to a method for fabricating a semiconductor device.

An object of the present invention is to provide a method for fabricating a semiconductor device which can improve conductivity of a channel region in the semiconductor device by increasing charge carrier mobility. Mechanical stress (e.g., compressive stress) can influence charge carrier mobility in a channel region of a PMOS transistor. The present invention increases compressive stress in a channel region of PMOS transistor to increase charge carrier mobility in the channel region. The increased charge carrier mobility results in improved performance of the PMOS transistor.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims, as well as the appended drawings.

To achieve these objects and other advantages and in accordance with the purpose of the invention, as embodied and broadly described herein, a method for fabricating a semiconductor device includes the steps of forming a first oxide film, a nitride film, and a second oxide film on a semiconductor substrate in succession, etching the second oxide film and the nitride film to form a second oxide film pattern and a nitride film pattern to expose a portion of the first oxide film, performing at least one nitrogen implantation to form a nitrogen injection region in the semiconductor substrate under the exposed portion of the first oxide film, forming a third oxide film on or over the second oxide film pattern, the nitride film pattern, and the semiconductor substrate, etching the third oxide film and the semiconductor substrate, including the nitrogen ion injection region, to form a trench that is deeper than the nitrogen ion injection region, and filling the trench with an oxide film to form a device isolating film.

In another aspect of the present invention, a method for fabricating a semiconductor device includes the steps of forming a first insulating film pattern on a semiconductor substrate, performing at least one nitrogen implantation into a portion of the semiconductor substrate using the first insulating film pattern as mask to form a nitrogen injection region, forming a second insulating film at sidewalls of the first insulating film pattern, anisotropically etching the second insulating film and the semiconductor substrate, including the nitrogen injection region, using the first insulating film pattern as a mask to form a trench that is deeper than the nitrogen injection region, and filling the trench with an oxide film to form a device isolating region.

It is to be understood that both the foregoing general description and the following detailed description of the present invention are exemplary and are intended to provide explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

FIGS. 1 to 7 illustrate sections showing the steps of a method for fabricating a semiconductor device.

Figure 1:
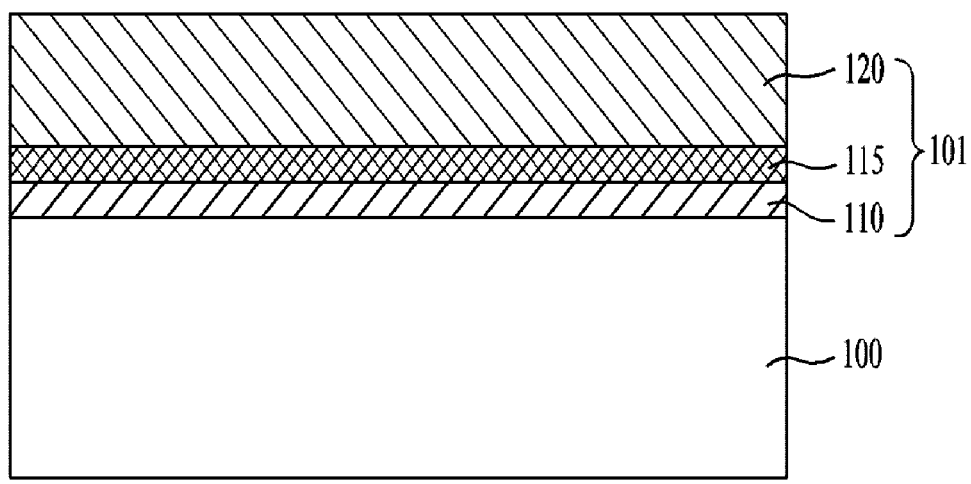
FIGS. 1 to 7 illustrate sections showing the steps of a method for fabricating a semiconductor device.

Referring to FIG. 1, a first insulating film 101 is formed on a semiconductor substrate 100. For an example, the first insulating film 101 can be an ONO layer (Oxide-Nitride-Oxide layer) comprising a first oxide film 110, a nitride film 115, and a second oxide film 120 stacked on the semiconductor substrate 100 in succession.

The first oxide film 110 may be formed by wet or dry thermal oxidation of the semiconductor substrate or chemical vapor deposition (CVD; e.g., plasma enhanced chemical vapor deposition [PECVD]). For example, the first oxide film 110 may be formed by CVD using tetraethylorthosilicate (TEOS) or silane (e.g., $SiH_4$) as a silicon source and dioxygen ($O_2$) and/or ozone ($O_3$) as an oxygen source. The nitride film 115 may be formed by physical vapor deposition (PVD; e.g., sputtering) or CVD (e.g., PECVD or Low Pressure CVD). The second oxide film 120 may be formed by CVD (e.g., as described above).

In exemplary embodiments, the first oxide film 110 can have a thickness of 40 Å~50 Å, and the second oxide film 120 can have a thickness of 1000 Å~1500 Å. That is, the second oxide film 120 may have a thickness greater than the first oxide film 110.

Figure 2:
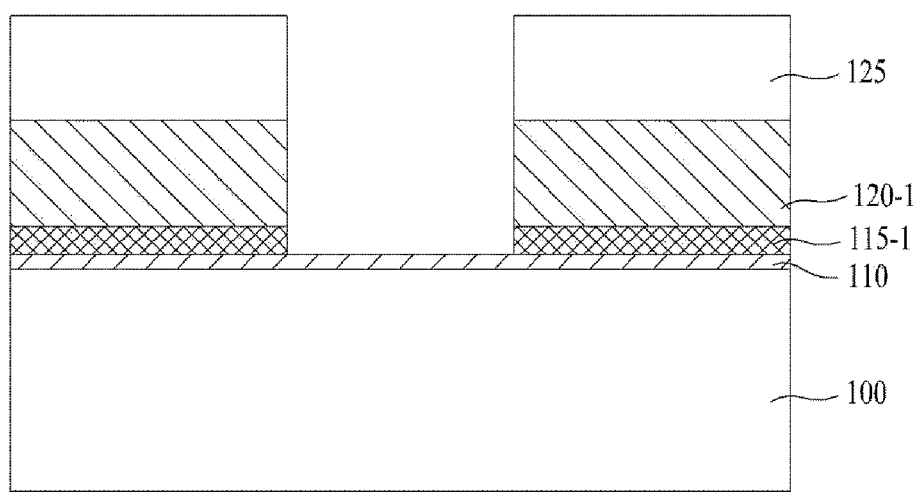

Then, referring to FIG. 2, a photoresist pattern 125 is formed on the second oxide film 120 by depositing a photoresist layer (e.g., a negative or positive photoresist material) over the second oxide film 120 and photolithographically patterning the photoresist layer. The opening in the photoresist pattern 125 may have a width of from about 100 to about 500 nm. Then, the second oxide film 120 and the nitride film 115 are etched in succession using the photoresist pattern 125 as a mask to expose a portion of the first oxide film 110.

Figure 3:
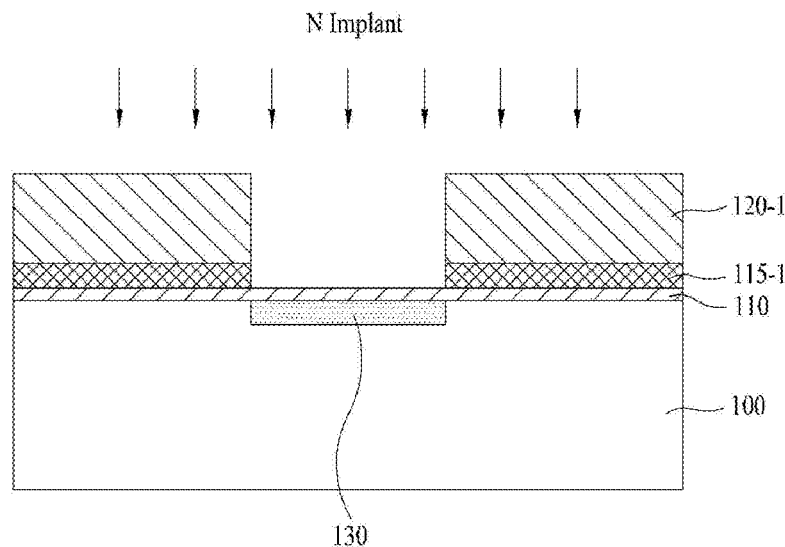

Referring to FIG. 3, the photoresist pattern 125 may be removed by asking or stripping. Then, at least one nitrogen implantation is performed using the second oxide film 120-1 (hereafter called as a second oxide film pattern) and the nitride film 115-1 (hereafter called as a nitride film pattern) as an implantation mask. The nitrogen is implanted into the semiconductor substrate 100 through the portion of the first oxide film 110 exposed by the second oxide film pattern 120-1 and the nitride film pattern 115-1 to form a nitrogen injection region 130 in an area of the semiconductor substrate 100 under the exposed portion of the first oxide film 110.

The nitrogen implantation may be performed in two steps. In the first step, the nitrogen is implanted at a dose of 1E15~2E15 atoms/cm$^2$ and at an implantation energy of 10~15 KeV. In the second step, the nitrogen is implanted at a dose of 1E15~2E15 atoms/cm$^2$ and at an implantation energy of 20~25 KeV. Thus, the ion dose may be the same in the first and second steps, but the implantation energy in the second step is higher than the implantation energy in the first step.

Alternatively, forming the nitrogen injection region 130 may include more than two nitrogen implantations, increasing the nitrogen implantation energy for each successive nitrogen implantation, in order to form a deep nitrogen injection area 130. For example, forming the nitrogen injection region 130 may include three to five separate nitrogen implantations, where the implantation energy of the first nitrogen implantation is 10-15 KeV, and the implantation energy of each successive implant is increased by 5-10 KeV (e.g., 15-25 KeV, then 20-35 KeV, etc.). The deep nitrogen injection area 130 formed increases the compressive stress applied to an active region of the semiconductor substrate 100, and the greater compressive stress improves conductivity of the channel region formed in the active region. That is, the compressive stress can increase mobility of hole carriers in a PMOS transistor channel.

Figure 4:
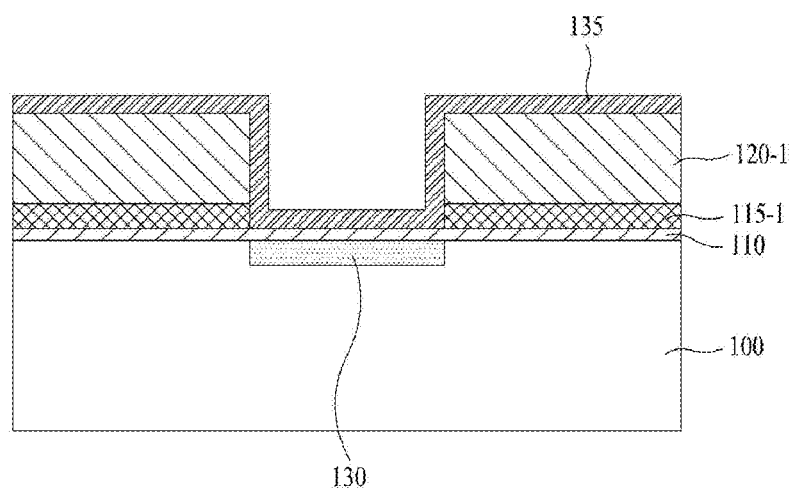

Referring to FIG. 4, a third oxide film 135, which may comprise a TEOS-based oxide, is deposited on or over an entire surface of the semiconductor substrate 100 having the second oxide film pattern 120-1 and the nitride film pattern 115-1 formed thereon. The third oxide film 135 may be deposited conformally into the opening in the second oxide film pattern 120-1 and the nitride film pattern 115-1, and may have a thickness of from about 20 to about 100 nm.

Figure 5:
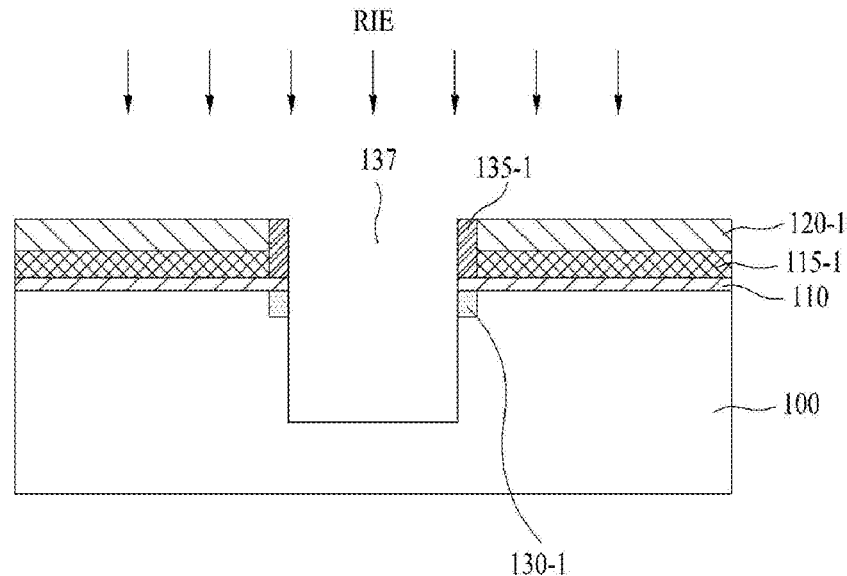

Referring to FIG. 5, the third oxide film 135 and the semiconductor substrate 100 are anisotropically etched using reactive ion etching. Since the second oxide film pattern 120-1 has a thickness greater than the first oxide film 110, and the semiconductor substrate 100 has an etch rate greater than an etch rate of the second oxide film pattern 120-1, the anisotropic etch forms a trench 137 having a greater depth than the nitrogen injection region 130 in the semiconductor substrate 100. Also, the anisotropic etch leaves a residual third oxide film 135-1 at sidewalls of the second oxide film pattern 120-1 and the nitride film pattern 115-1, which acts as an etch mask for a peripheral portion 130-1 of the nitrogen injection region 130.

A portion 130-1 of the nitrogen injection region remains in the semiconductor substrate 100 at the upper sidewalls of the trench 137. As shown in FIG. 4, a peripheral region 130-1 of the nitrogen injection region 130 is masked by the residual third oxide film 135 during the anisotropic etch, and thus remains in the semiconductor substrate 100 in the vicinity of upper edges of the trench 137. This is because the third oxide film 135 reduces an area of the semiconductor substrate exposed at the time of the anisotropic etch to form the trench 137.

Then, referring to FIG. 5, since the residual third oxide film 135-1 serves as an etch barrier during the anisotropic etch to form trench 137, the peripheral region 130-1 of the nitrogen injection region 130 can remain in the semiconductor substrate 100 in the vicinity of upper edges of the trench 137 after the reactive ion etch. That is, a width of the trench 137 shown in FIG. 5 is smaller than a width of the nitrogen injection region 130 shown in FIG. 3. For example, the trench 137 may have a width that is about 40-200 nm smaller (or from about 10% to about 100% smaller) than the width of the nitrogen injection region 130.

Figure 6:
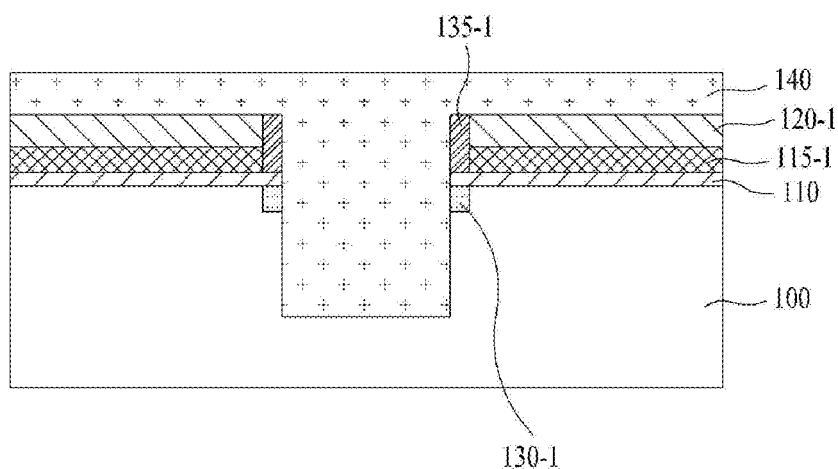

Referring to FIG. 6, a fourth oxide film 140 is formed on or over the semiconductor substrate 100 to fill the trench 137 with the oxide film. The oxide film 140 may be formed by CVD (e.g., oxide film 140 may comprise a TEOS-based oxide formed by PECVD).

Figure 7:
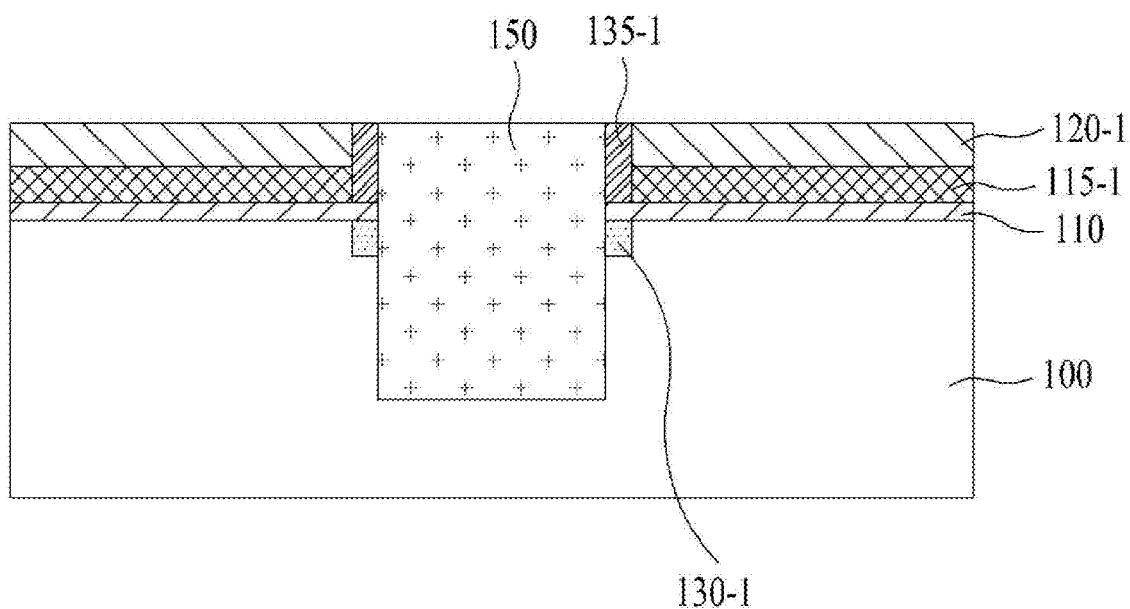

Referring to FIG. 7, a chemical mechanical polishing (CMP) step is performed to planarize and remove the oxide film 140 until the oxide pattern 120-1 is exposed, and form a device isolating film 150. The device isolating film 150 divides the semiconductor substrate 100 into a device isolation region (the area of the semiconductor substrate 100 where the device isolation film 150 is formed) and an active region.

The peripheral portion 130-1 of the nitrogen injection region formed in the semiconductor substrate 100 in the upper sidewalls of the trench 137 and located near upper edges of the device isolating film 150 applies compressive stress to the active region(s) of the semiconductor substrate 100. The applied compressive stress improves conductivity of a channel region formed in the active region. Specifically, the compressive stress can improve mobility of the hole carriers in a PMOS transistor channel. Since the compressive stress to the channel region improves the mobility of the holes, the performance of a P type transistor can be improved.

Moreover, by improving the mobility of the hole carriers in the channel region (e.g., as a result of the dose of the nitrogen and the implant energy for forming the nitrogen injection region), a desired drain current can be more easily obtained.

Furthermore, since the nitrogen ion is injected only into the device isolation region and a portion of the active region where a source and a drain are to be formed, the implanted nitrogen ions do not directly influence a dopant in the channel region.

A method for fabricating a semiconductor device in accordance with another preferred embodiment of the present invention will be described, which is different from the method described with reference to FIGS. 1 to 7.

A first oxide film, a nitride film, and a second oxide film are formed on a semiconductor substrate in succession, as described above. Then, the second oxide film, the nitride film, and the first oxide film are etched in succession, to form a first insulating film pattern which exposes a portion of the semiconductor substrate. Unlike the method shown in FIG. 2 where the first oxide film 110 is not etched, in this embodiment of the present invention, the first oxide film is etched to expose the semiconductor substrate.

At least one nitrogen implantation is performed to implant nitrogen into an exposed portion of the semiconductor substrate 100 using the first insulating film pattern as a mask, to form a nitrogen injection region. The nitrogen implantations can be performed as described before.

Then, a second insulating film (which may comprise a CVD TEOS-based oxide) is formed at sidewalls of the first insulating film pattern. The second insulating film covers a peripheral region of the nitrogen injection region. The semiconductor substrate is then anisotropically etched through the nitrogen injection region to form a trench that is deeper than the nitrogen injection region. As a result, the area of the semiconductor substrate where the peripheral region of the nitrogen injection region is formed is not etched. Thus, the peripheral region of the nitrogen injection region remains in an upper sidewall of the trench of the trench. Then, the trench is filled with an oxide film in to form a device isolating region, as described above.

As previously discussed, the method for fabricating a semiconductor device of the present invention has the following advantage(s). Since the peripheral region of the nitrogen injection region that remains at the upper sidewalls of the trench applies compressive stress to the active region of the semiconductor substrate, the channel region formed in the active region has improved conductivity, particularly in a PMOS transistor.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a semiconductor device comprising the steps of:
    forming a first oxide film, a nitride film, and a second oxide film on or over a semiconductor substrate in succession;
    etching the second oxide film and the nitride film to form a second oxide film pattern and a nitride film pattern, exposing a portion of the first oxide film;
    performing at least one nitrogen implantation to form a nitrogen injection region in the semiconductor substrate under the first oxide film;
    forming a third oxide film on or over the second oxide film pattern, the nitride film pattern, and the semiconductor substrate;
    forming a trench having a depth that is greater than a depth of by the nitrogen injection region by etching the third oxide film and the semiconductor substrate; and
    filling the trench with an oxide film to form a device isolating film.

2. The method as claimed in claim 1, wherein the step of performing at least one nitrogen implantation to form a nitrogen injection region comprises a plurality of nitrogen implantations, where an energy of a first nitrogen implantation is different from an energy of a second nitrogen implantation.

3. The method as claimed in claim 1, wherein the step performing at least one nitrogen implantation to form a nitrogen injection region comprises:
    first implanting nitrogen at a first dose of 1E15~2E15 atoms/cm$^2$ at a first energy of 10~15 KeV; and
    second implanting nitrogen at a second dose of 1E15~2E15 atoms/cm$^2$ at a second energy of 20~25 KeV.

4. The method as claimed in claim 1, wherein the second oxide film has a thickness greater than a thickness of the first oxide film.

5. The method as claimed in claim 1, wherein the first oxide film, the second oxide film, and the third oxide film comprise TEOS.

6. The method as claimed in claim 1, wherein the step of forming the trench comprises anisotropically etching the third oxide film to form a residual third oxide film at sidewalls of the second oxide film pattern and the nitride film pattern.

7. The method as claimed in claim 6, wherein anisotropically etching the semiconductor substrate comprises using the residual portion of the third oxide film as an etch mask.

8. The method as claimed in claim 7, wherein a residual portion of the nitrogen injection region remains along sidewalls of the trench after the trench is formed.

9. The method as claimed in claim 8, wherein the residual portion of the nitrogen injection region is in an active region of the semiconductor substrate.

10. The method as claimed in claim 1, wherein the trench has a width smaller than a width of the nitrogen injection region.

11. A method for fabricating a semiconductor device comprising:
    forming a first insulating film pattern on a semiconductor substrate;
    performing at least one nitrogen implantation into a portion of the semiconductor substrate using the first insulating film pattern as mask to form a nitrogen injection region;
    forming a second insulating film at sidewalls of the first insulating film pattern;
    forming a trench having a depth greater than the nitrogen injection region by anisotropically etching the semiconductor substrate using the first insulating film pattern and the second insulating film as a mask, to remove the nitrogen injection region except for a peripheral region of the nitrogen injection region along an upper sidewall of the trench; and
    filling the trench with an oxide film to form a device isolating region.

12. The method as claimed in claim 11, wherein performing at least one nitrogen implantation comprises:
    performing a first nitrogen implantation at a first dose of 1E15~2E15 atoms/cm$^2$ and at a first energy of 10~15 KeV; and
    performing a second nitrogen implantation at a second dose of 1E15~2E15 atoms/cm$^2$ and at a second implantation energy of 20~25 KeV.

13. The method as claimed in claim 11, wherein performing at least one nitrogen implantation comprises a plurality of nitrogen implantations where a first nitrogen implantation energy differs from a second nitrogen implantation energy.

14. The method as claimed in claim 11, wherein forming the trench comprises etching a portion of the second insulating film formed over a portion of the semiconductor substrate exposed by the first insulating film pattern.

15. The method as claimed in claim 14, wherein a residual portion of the second insulating film remains at sidewalls of the first insulating film pattern after the trench is formed.

16. The method as claimed in claim 11, wherein the peripheral region of the nitrogen injection region is in an active area of the semiconductor substrate.

17. The method as claimed in claim 11, further comprising performing chemical mechanical polishing to remove a portion of the oxide film and expose the upper surface of the first insulating film pattern.

18. The method as claimed in claim 11, wherein the first insulating film pattern comprises a first oxide film, a nitride film, and a second oxide film, and the second insulating film comprises a TEOS-based oxide.

19. A method for fabricating a semiconductor device comprising the steps of:
   forming a first insulating film pattern on a semiconductor substrate;
   performing a plurality of nitrogen implantations into a portion of the semiconductor substrate using the first insulating film pattern as mask to form a nitrogen injection region, where a first nitrogen implantation energy differs from a second nitrogen implantation energy;
   forming a second insulating film at sidewalls of the first insulating film pattern;
   forming a trench having a depth greater than the nitrogen injection region by anisotropically etching the semiconductor substrate using the first insulating film pattern and the second insulating film as a mask, to remove the nitrogen injection region except for a peripheral region of the nitrogen injection region along an upper sidewall of the trench; and
   filling the trench with an oxide film to form a device isolating region.

20. The method as claimed in claim 19, wherein forming the second insulating film comprises anisotropically etching an oxide film on the first insulating film pattern to leave an insulating spacer along the sidewalls of the first insulating film pattern.

* * * * *